US011754935B2

(12) United States Patent
Vladimirsky et al.

(10) Patent No.: US 11,754,935 B2
(45) Date of Patent: Sep. 12, 2023

(54) LITHOGRAPHIC PATTERNING DEVICE MULTICHANNEL POSITION AND LEVEL GAUGE

(71) Applicant: ASML HOLDING N.V., Veldhoven (NL)

(72) Inventors: Yuli Vladimirsky, Weston, CT (US); Lev Ryzhikov, Norwalk, CT (US)

(73) Assignee: ASML HOLDING N.V., Veldhoven (NL)

( * ) Notice: Subject to any disclaimer, the term of this patent is extended or adjusted under 35 U.S.C. 154(b) by 0 days.

(21) Appl. No.: 17/616,081

(22) PCT Filed: May 26, 2020

(86) PCT No.: PCT/EP2020/064609
§ 371 (c)(1),
(2) Date: Dec. 2, 2021

(87) PCT Pub. No.: WO2020/249394
PCT Pub. Date: Dec. 17, 2020

(65) Prior Publication Data
US 2022/0299893 A1 Sep. 22, 2022

Related U.S. Application Data

(60) Provisional application No. 62/861,615, filed on Jun. 14, 2019.

(51) Int. Cl.
*G03F 9/00* (2006.01)
*G03F 7/00* (2006.01)

(52) U.S. Cl.
CPC ......... *G03F 9/7088* (2013.01); *G03F 7/7085* (2013.01); *G03F 9/7011* (2013.01)

(58) Field of Classification Search
CPC .. G03F 7/7085; G03F 7/70633; G03F 9/7011; G03F 9/7023; G03F 9/7069; G03F 9/7088; G03F 9/7092; G03F 9/7049
See application file for complete search history.

(56) References Cited

U.S. PATENT DOCUMENTS

| | | | |
|---|---|---|---|
| 5,859,707 | A | 1/1999 | Nakagawa et al. |
| 2002/0009175 | A1 | 1/2002 | Kurosawa |

(Continued)

FOREIGN PATENT DOCUMENTS

WO 2016192865 12/2016

OTHER PUBLICATIONS

International Search Report and Written Opinion issued in corresponding PCT Patent Application No. PCT/EP2020/064609, dated Nov. 13, 2020.

*Primary Examiner* — Peter B Kim
(74) *Attorney, Agent, or Firm* — Pillsbury Winthrop Shaw Pittman, LLP

(57) ABSTRACT

A patterning device alignment system including a multipath sensory array including a first collimating light path and one or more other light paths, a first detector positioned at a first end of the first collimating light path, and a second detector positioned at a first end of the one or more other light paths, the first detector configured to receive a reflected illumination beam from an illuminated patterning device and calculate a tilt parameter of the patterning device, and the second detector configured to receive a second reflected illumination beam from a beam splitter and calculate an X-Y planar location position and a rotation position of the patterning device.

20 Claims, 10 Drawing Sheets

(56) References Cited

U.S. PATENT DOCUMENTS

| | | |
|---|---|---|
| 2004/0090606 A1 | 5/2004 | Ishikawa |
| 2013/0021588 A1 | 1/2013 | Matsumoto et al. |
| 2015/0227061 A1 | 8/2015 | Tinnemans et al. |
| 2019/0204759 A1* | 7/2019 | Shome .................. G03F 9/7073 |

* cited by examiner

LITHOGRAPHIC PATTERNING DEVICE MULTICHANNEL POSITION AND LEVEL GAUGE

CROSS-REFERENCE TO RELATED APPLICATIONS

This application is the U.S. national phase entry of PCT Patent Application No. PCT/EP2020/064609, which was filed on May 26, 2020, which claims the benefit of priority of U.S. Provisional Patent Application No. 62/861,615, which was filed on Jun. 14, 2019, and which is incorporated herein in its entirety by reference.

FIELD

The present disclosure relates to patterning device position alignment sensors, for example, determining patterning device position and alignment parameters in lithographic apparatuses and systems.

BACKGROUND

A lithographic apparatus is a machine that applies a desired pattern onto a substrate, usually onto a target portion of the substrate. A lithographic apparatus can be used, for example, in the manufacture of integrated circuits (ICs) or other devices designed to be functional. In that instance, a patterning device, which is alternatively referred to as a mask or a reticle, may be used to generate a circuit pattern to be formed on an individual layer of the device designed to be functional. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

Manufacturing devices, such as semiconductor devices, typically involves processing a substrate (e.g., a semiconductor wafer) using a number of fabrication processes to form various features and often multiple layers of the devices. Such layers and/or features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a pattern transfer step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching the pattern by an etch apparatus, etc. Further, one or more metrology processes are involved in the patterning process.

Metrology processes are used at various steps during a patterning process to monitor and/or control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), one or more variables of the patterning process may be designed or altered, e.g., based on the measurements of the one or more characteristics, such that substrates manufactured by the patterning process have an acceptable characteristic(s).

With the advancement of lithography and other patterning process technologies, the dimensions of functional elements have continually been reduced while the amount of the functional elements, such as transistors, per device has been steadily increased over decades. In the meanwhile, the requirement of accuracy in terms of overlay, critical dimension (CD), etc. has become more and more stringent. Error, such as error in overlay, error in CD, etc., will inevitably be produced in the patterning process. For example, imaging error may be produced from optical aberration, patterning device heating, patterning device error, and/or substrate heating and can be characterized in terms of, e.g., overlay, CD, etc. Additionally or alternatively, error may be introduced in other parts of the patterning process, such as in etch, development, bake, etc. and similarly can be characterized in terms of, e.g., overlay, CD, etc. The error may cause a problem in terms of the functioning of the device, including failure of the device to function or one or more electrical problems of the functioning device. Accordingly, it is desirable to be able to characterize one or more these errors and take steps to design, modify, control, etc. a patterning process to reduce or minimize one or more of these errors.

One such error that may be produced involves the transfer of the patterning device to and along with a corresponding patterning device electrostatic chuck. Such transfer may result in potential damage to the patterning device, chuck, or both, if a relative tilt of the patterning device and patterning device electrostatic chuck is improper. For example, variations of the patterning device mechanical and positioning tolerances, can lead to high corner impacts and unpredictable first contact points with the electrostatic chuck, thus potentially damaging one or both.

Moreover, the relative tilt of the patterning device and/or damage caused by the titled patterning device as it is transferred to the electrostatic chuck may also cause potential inaccuracies in the patterning process, which may result in damaged or non-performing circuits. As such, these errors can also contribute to added costs due to damage of the equipment, inefficient processing, waste, and processing delays.

SUMMARY

Accordingly, there is a need to provide pre-alignment measurements of a patterning device, including tilt measurements, and subsequent corrective measures to protect the patterning device and an electrostatic chuck during a transfer operation, and further, to ensure patterning accuracy.

In some embodiments, a patterning device alignment system includes a multipath sensory array including a first collimating light path and one or more other light paths; a first detector positioned at a first end of the first collimating light path; and a second detector positioned at a first end of the one or more other light paths. The first detector may receive a reflected illumination beam from an illuminated patterning device and may calculate a tilt parameter of the patterning device. The second detector may receive a second reflected illumination beam from a beam splitter and may calculate an X-Y planar location position and a rotation position of the patterning device.

In some embodiments, the first collimating light path includes the beam splitter and a collimator, the beam splitter being located at a second end of the first collimating light path that is opposite the first end, and may split the reflected illumination beam into a first reflected illumination beam and the second reflected illumination beam, the first reflected illumination beam being directed towards a collimator that narrows the first illumination beam onto the first detector.

In some embodiments, the collimator is located within the first collimating light path.

In some embodiments, the patterning device alignment system further includes a light source that illuminates the patterning device, and the light source may be a co-axial Kohler illumination source. In some embodiments, the light source may be positioned at an inline position between the first collimating light path and the one or more other light paths. In other embodiments, the light source may be positioned within the first collimating light path.

In some embodiments, the patterning device alignment system further includes a controller including circuitry that receives the calculated tilt parameter of the patterning device from the first detector, and in response to the tilt parameter being above a threshold, provide a determination triggering a cancellation of a patterning device transfer operation to a patterning device chuck.

In some embodiments, the light source simultaneously illuminates the first collimating light path and one of the one or more other light paths.

In some embodiments, the patterning device alignment system further includes a light source that generates a collimated beam, the collimated beam illuminates the patterning device, wherein the first detector is configured to measure the patterning device tilt based on a displacement measurement between a focal point of the detector and a point created by the received first reflected illumination beam.

In some embodiments, the first detector includes a plurality of sensor arrays.

In some embodiments, a lithographic apparatus includes a patterning device alignment system includes a multichannel sensory array including a first collimating light path and one or more other light paths; a first detector positioned at a first end of the first collimating light path; and a second detector positioned at a first end of the one or more other light paths. The first detector may receive a reflected illumination beam from an illuminated patterning device and may calculate a tilt parameter of the patterning device. The second detector may receive a second reflected illumination beam from a beam splitter and may calculate an X-Y planar location position and a rotation position of the patterning device.

In some embodiments, the first collimating light path includes the beam splitter and a collimator, the beam splitter being located at a second end of the first collimating light path that is opposite the first end, and may split the reflected illumination beam into a first reflected illumination beam and the second reflected illumination beam, the first reflected illumination beam being directed towards a collimator that narrows the first illumination beam onto the first detector.

In some embodiments, the collimator is located within the first collimating light path.

In some embodiments, the patterning device alignment system of the lithographic apparatus further includes a light source that illuminates the patterning device, and the light source may be a co-axial Kohler illumination source. In some embodiments, the light source may be positioned at an inline position between the first collimating light path and the one or more other light paths. In other embodiments, the light source may be positioned within the first collimating light path.

In some embodiments, the patterning device alignment system of the lithographic apparatus further includes a controller including circuitry that receives the calculated tilt parameter of the patterning device from the first detector, and in response to the tilt parameter being above a threshold, provide a determination triggering a cancellation of a patterning device transfer operation to a patterning device chuck.

In some embodiments, the light source simultaneously illuminates the first collimating light path and one of the one or more other light paths.

In some embodiments, the patterning device alignment system further includes a light source that generates a collimated beam, the collimated beam illuminates the patterning device, wherein the first detector is configured to measure the patterning device tilt based on a displacement measurement between a focal point of the detector and a point created by the received first reflected illumination beam.

In some embodiments, the first detector includes a plurality of sensor arrays.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
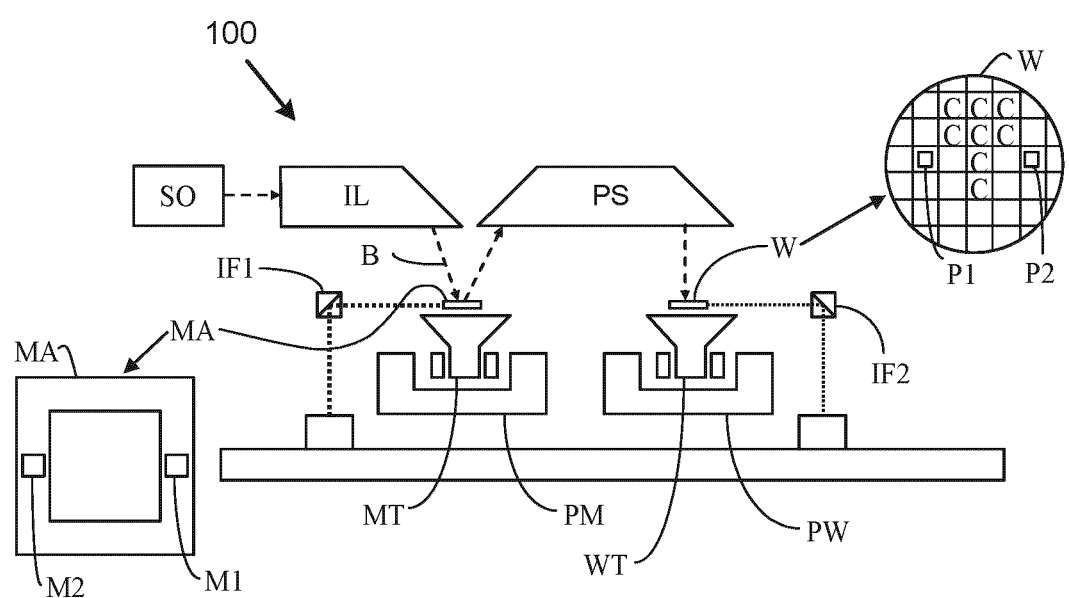
FIG. 1A shows a schematic of a reflective lithographic apparatus, according to some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" can be used herein to indicate the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the present disclosure can be implemented in hardware, firmware, software, or any combination thereof. Embodiments of the present disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, non-transitory computer readable instructions, etc.

Before describing such embodiments in more detail, however, it is instructive to present an example environment in which embodiments of the present disclosure can be implemented.

Example Lithographic Systems

Figure 1B:
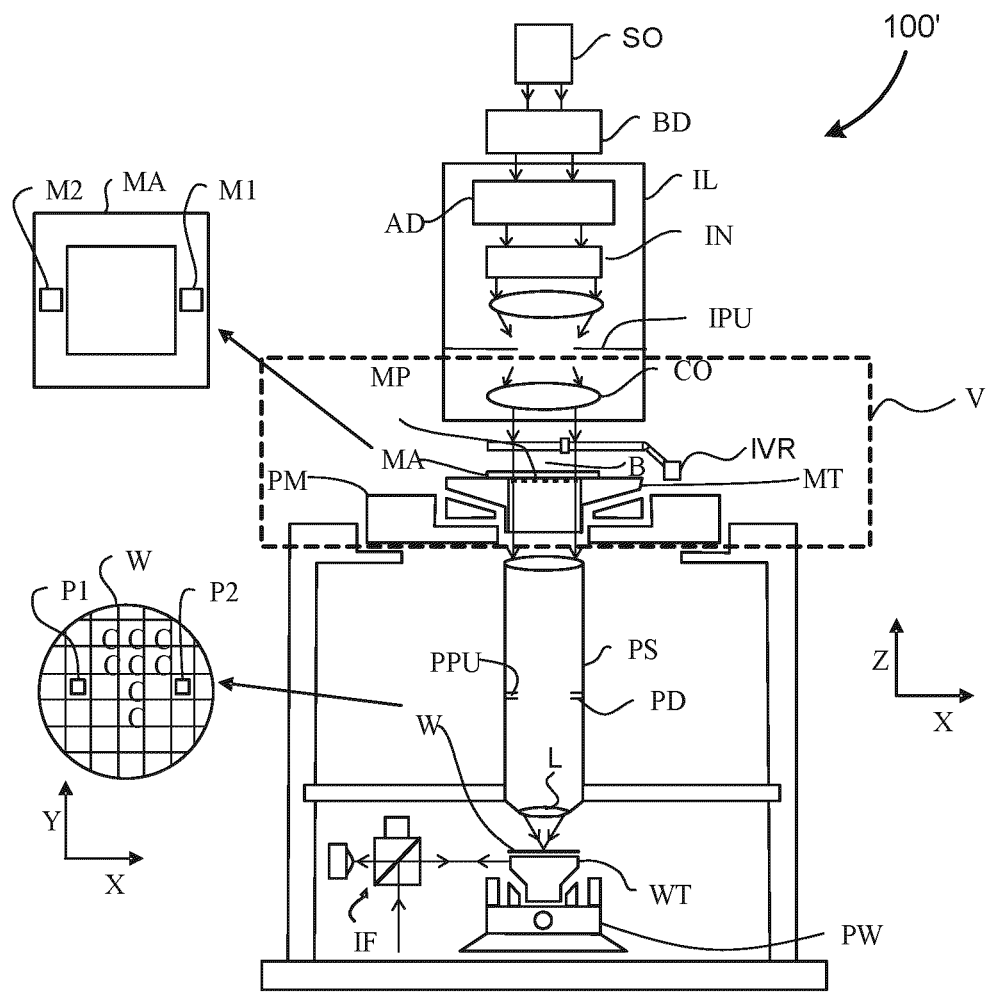
FIG. 1B shows a schematic of a transmissive lithographic apparatus, according to some embodiments.

FIGS. 1A and 1B show schematics of a lithographic apparatus 100 and lithographic apparatus 100', respectively, according to some embodiments. In some embodiments, lithographic apparatus 100 and lithographic apparatus 100' each include the following: an illumination system (illuminator) IL configured to condition a radiation beam B (for example, deep ultra violet or extreme ultra violet (EUV) radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. As will be further described herein, other configurations of the illuminator may be implemented to for improved illumination, and compactness of design.

Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' may be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In some embodiments, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

Lithographic apparatus 100' may include a patterning device transfer system. An example patterning device transfer system may be a patterning device exchange apparatus (V) including, for example, in-vacuum robot IVR, mask table MT, first positioner PM and other like components for transferring and positioning a patterning device. Patterning device exchange apparatus V may be configured to transfer patterning devices between a patterning device carrying container and a processing tool (e.g. lithographic apparatus 100').

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In some embodiments, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
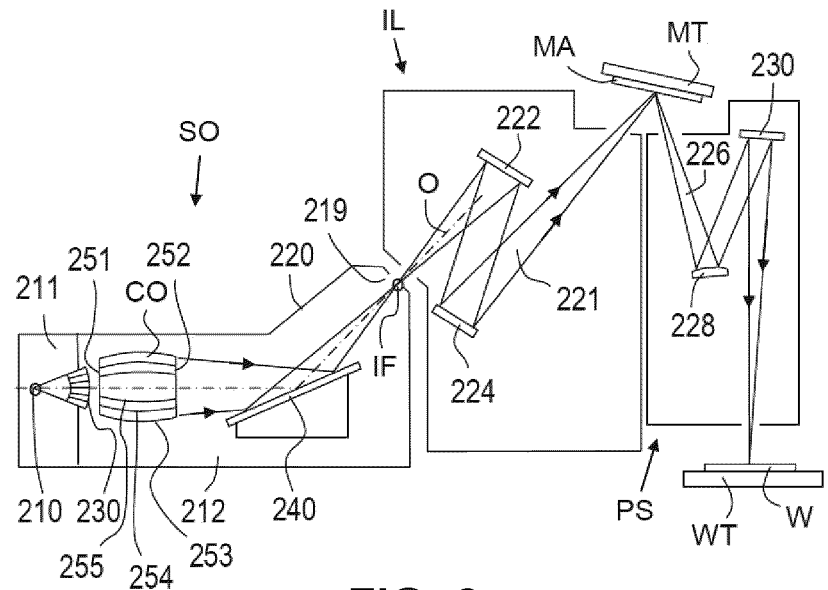
FIG. 2 shows a detailed schematic of a reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO.

An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Exemplary Lithographic Cell

Figure 3:
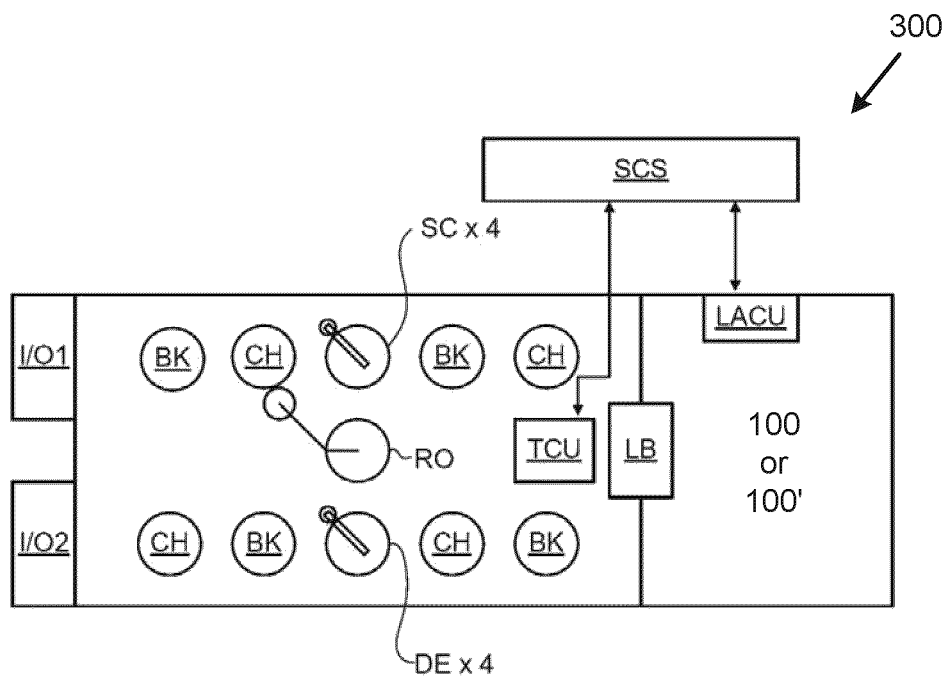
FIG. 3 shows a schematic of a lithographic cell, according to some embodiments.

FIG. 3 shows a schematic of a lithographic cell 300, also sometimes referred to a lithocell or cluster. Lithographic apparatus 100 or 100' may form part of lithographic cell 300. Lithographic cell 300 may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Exemplary Metrology System

Figure 4:
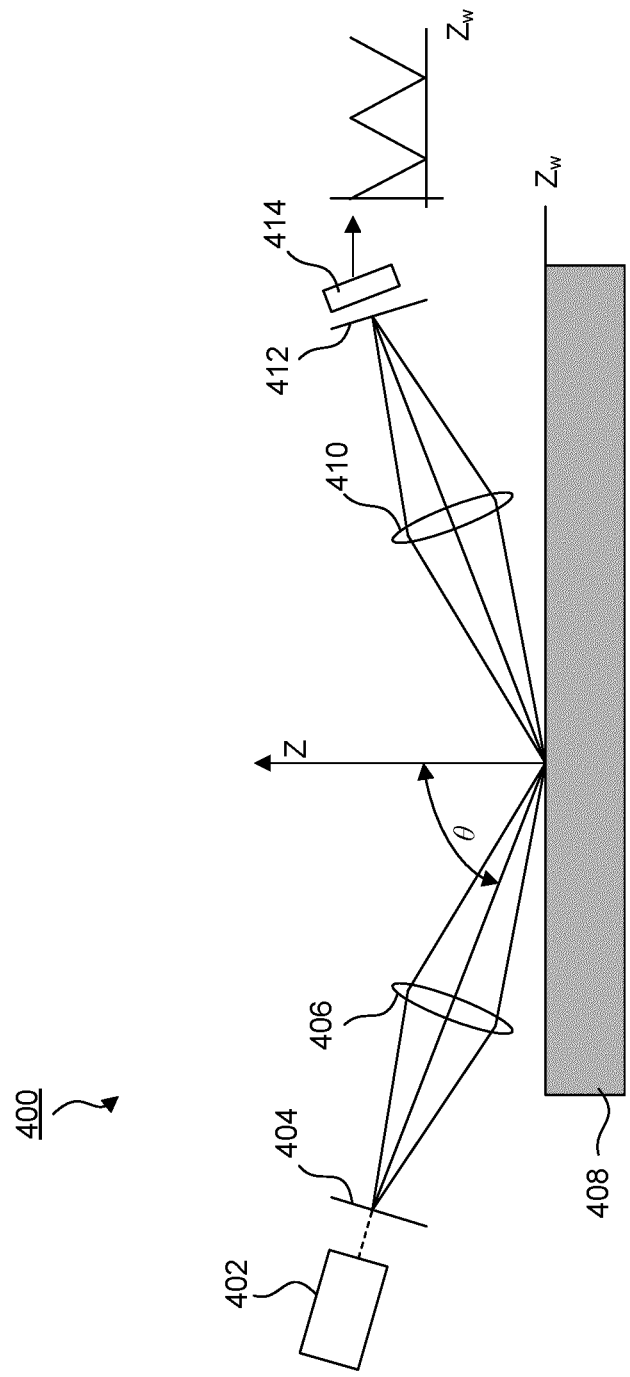
FIG. 4 shows a schematic of a metrology system, according to some embodiments.

FIG. 4 shows a schematic of a metrology system 400 that can be implemented as a part of lithographic apparatus 100 or 100', according to some embodiments. In some embodiments, metrology system 400 may be configured to measure height and height variations on a surface of substrate W. In some embodiments, metrology system 400 may be configured to detect positions of alignment marks on the substrate and to align the substrate with respect to the patterning device or other components of lithography apparatus 100 or 100' using the detected positions of the alignment marks.

In some embodiments, metrology system 400 may include a radiation source 402, a projection grating 404, a detection grating 412, and a detector 414. Radiation source 402 may be configured to provide an electromagnetic narrow band radiation beam having one or more passbands. In some embodiments, the one or more passbands may be within a spectrum of wavelengths between about 500 nm to about 900 nm. In another example, the one or more passbands may be discrete narrow passbands within a spectrum of wavelengths between about 500 nm to about 900 nm. In another example, radiation source 402 generates light within the ultraviolet (UV) spectrum of wavelengths between about 225 nm and 400 nm. Radiation source 402 may be further configured to provide one or more passbands having substantially constant center wavelength (CWL) values over a long period of time (e.g., over a lifetime of radiation source 402). Such configuration of radiation source 402 may help to prevent the shift of the actual CWL values from the desired CWL values, as discussed above, in current metrology systems. And, as a result, the use of constant CWL values may improve long-term stability and accuracy of metrology systems (e.g., metrology system 400) compared to the current metrology systems.

Projection grating 404 may be configured to receive the beam (or beams) of radiation generated from radiation source 402, and provide a projected image onto a surface of a substrate 408. Imaging optics 406 may be included between projection grating 404 and substrate 408, and may include one or more lenses, mirrors, gratings, etc. In some embodiments, imaging optics 406 is configured to focus the image projected from projection grating 404 onto the surface of substrate 408.

In some embodiments, projection grating 404 provides an image on the surface of substrate 408 at an angle θ relative to the surface normal. The image is reflected by the substrate surface and is re-imaged on detection grating 412. Detection grating 412 may be identical to projection grating 404. Imaging optics 410 may be included between substrate 408 and substrate detection grating 412, and may include one or more lenses, mirrors, gratings, etc. In some embodiments, imaging optics 410 is configured to focus the image reflected from the surface of substrate 408 onto detection grating 412. Due to the oblique incidence, a height variation ($Z_w$) in the surface of substrate 408 will shift the image projected by projection grating 404 when it is received by detection grating 412 over a distance(s) as given by the following equation (1):

$$s = 2Z_w \sin(\theta) \qquad (1)$$

In some embodiments, the shifted image of projection grating 404 is partially transmitted by detection grating 412 and the transmitted intensity, which is a periodic function of the image shift. This shifted image is received and measured by detector 414. Detector 414 may include a photodiode or photodiode array. Other examples of detector 414 include a CCD array. In some embodiments, detector 414 may be designed to measure wafer height variations as low as 1 nm based on the received image.

Exemplary Embodiments of a Patterning Device Alignment and Tilt System

Figure 5:
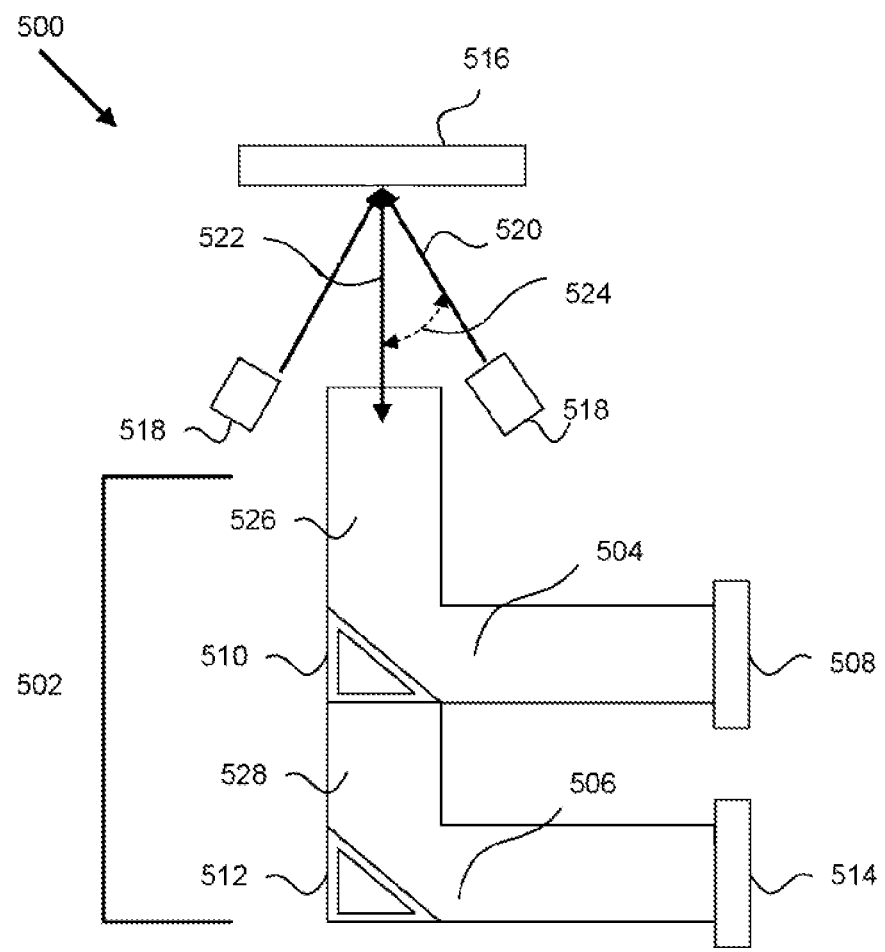
FIG. 5 shows a schematic of a pre-alignment sensor measuring positioning of a patterning device in X-, Y-positions and Rx orientation using tilted illumination, according to some embodiments.

FIG. 5 shows a schematic of a pre-alignment system 500 measuring positioning of a patterning device in X-, Y-positions and Rx orientation using tilted illumination, according to some embodiments.

In one embodiment, pre-alignment system 500 may be a patterning device (e.g. reticle) pre-alignment system that includes a multipath sensory array 502 including one or more systems, e.g., optical, image, or lens systems, each including a path, light path, light channel, lens channel, or the like. For example, in one embodiment, multipath sensory array 502 includes an upper image lens system 504 and a lower image lens system 506.

It is understood within this specification that the terms optical or lens system and optical, light, light path, or lens channel may be used interchangeably. Accordingly, upper light path 504 may include a light detector or a sensor 508 and a beam splitter 510, each being placed at an opposite end of the other. For example, beam splitter 510 may be located at one end of upper light path 504 in line with other light paths that may receive a light beam from an illuminated patterning device. For example, the light beam may be reflected, diffracted, scattered, or the like from the patterning device.

Beam splitter 510 may split the received light beam into two beams, the first may be directed onto detector 508, and the second may be directed towards lower light path 506. Lower light path 506 may include a beam splitter or a mirror (depending on whether additional lower channels are utilized). In the present embodiment, lower light path 506 may include mirror 512 that reflects the incident light onto detector 514.

Detectors 508 and 514 may each be formed of a sensor or an array of sensors that may be capacitive or include one or more planar electrodes. Each sensor or array may be optical and may include a light detector, such as a photodiode, (e.g. a quadrant avalanche photodiode or the like).

In some embodiments, a patterning device transfer apparatus (e.g. patterning device exchange apparatus V in FIG. 1B) may be configured to minimize patterning device/reticle exchange time, particle generation, and reduce contact forces or stresses from a chuck and/or a patterning device, such as patterning device 516. The patterning device exchange apparatus V may also increase overall throughput in a patterning device exchange process, for example, in a lithographic apparatus LA.

In some embodiments, upon detecting the presence of patterning device 516, pre-alignment system 500 may illuminate the patterning device to perform the requisite inspection measurements. As shown in FIG. 5, in one example pre-alignment system 500 may utilize a series of illuminators 518 configured in a tilted illumination scheme to project incident beams 520 onto patterning device 516. Depending on the illumination, 516 may reflect the light and provide a plurality of reflected beams 522 where the angle between the incident beams 520 and the reflected beams 522 is the diffraction angle 524.

In some embodiments, pre-alignment system 500 utilizes the two channel configuration described in FIG. 5 to measure patterning device position offsets. For example, pre-alignment system 500 may utilize upper light path 504 and lower light path 506 to measure the X-Y position of the patterning device and the orientation of the patterning device (e.g. the Rz orientation).

In some embodiments, pre-alignment system 500 may include a common light path group (or lens channel) 526 and a bottom light path group 528. Incident and reflected light beams may pass through common light path group 526 and bottom light path group 528. In one example, common light path group 526 may redirect reflected light beam 524 towards sensor 508 using beam splitter 510. Similarly, bottom light path group 528 may redirect reflected light beam 524 towards sensor 514.

In some embodiments, upper light path 504 and lower light path 506 may be imaging light paths that may be set up with different configurations to measure different characteristics of reflected light beams. For example, when patterning device 516 is illuminated, the incident light may be reflected (or scattered in this instance) and partially modified by patterns found on the patterning device. Upon receiving the scattered light beam, upper light path 504 and lower light path 506 receive the same beam signal and depending on their set up, may provide analysis and measurements for different optical characteristics of patterning device 516. In one example, upper light path 504 may receive the light beam and project the image of the patterning device onto sensor 508. Similarly, lower light path 506 may receive the light beam and project the image of the patterning device onto sensor 514. In other examples, lower light path 506 may invert the image of the patterning device to measure different alignment and/or positioning attributes.

In yet another example, sensor 508 may be configured to measure X- and Y-positions of patterning device by processing the image of the patterning device and detecting device markers on the patterning device. Additionally, sensor 508 may be configured as a bar code reader and may be configured to read a bar code within the patterning device image to identify the patterning device. Upper light path 504 and lower light path 506 may be configured, along with their respective sensors, to perform other optical measurements of patterning device image.

Figure 6:
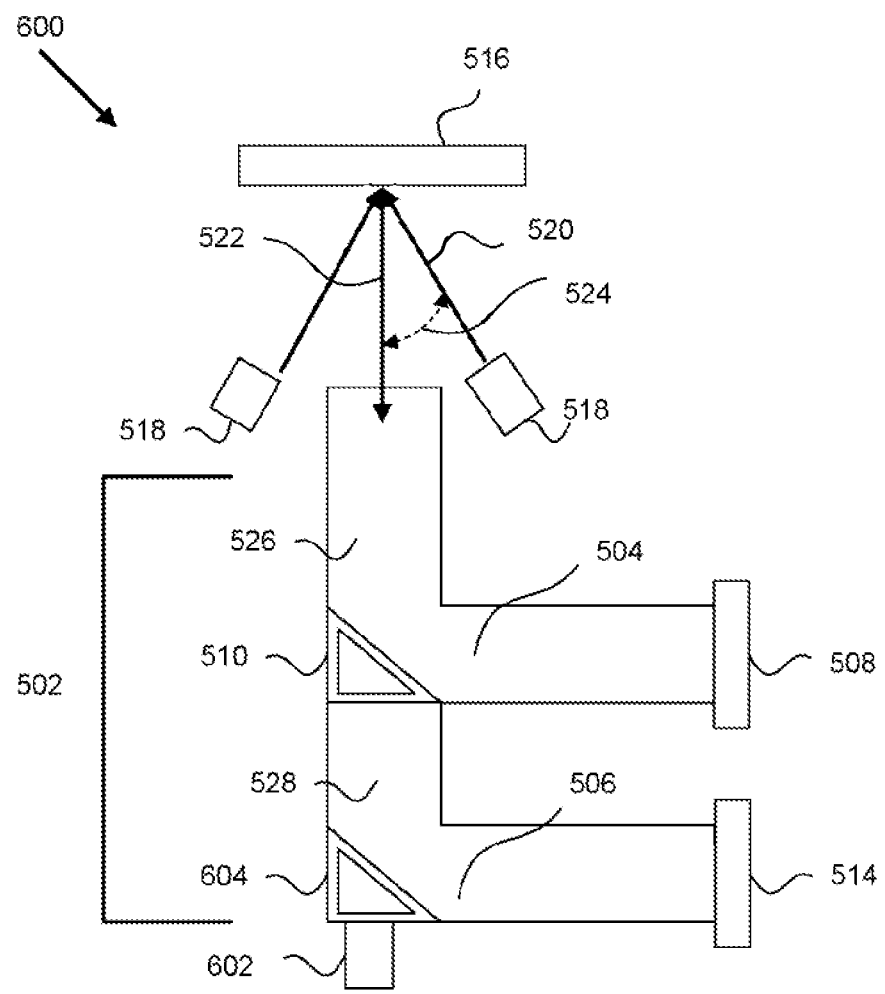
FIG. 6 shows a schematic of a pre-alignment sensor measuring positioning of a patterning device in X-, Y-positions and Rx orientation using coaxial illumination, according to some embodiments.

FIG. 6 shows a schematic of a pre-alignment sensor 600 measuring positioning of a patterning device in X-, Y-positions and Rx orientation using coaxial illumination, according to some embodiments. Pre-alignment sensor 600 may be equivalent in construction and components to that of pre-alignment sensor 500, with a difference: pre-alignment sensor 600 utilizes a coaxial illumination source 602 that is configured to illuminate a beam splitter 604 and provides the illumination and incident beam onto the patterning device.

In the example described in FIG. 5, a pre-alignment sensor, such as an EUV pre-alignment sensor may utilize tilted illumination provided by, for example, four (4) light emitting diodes (LEDs) at an angle designed to satisfy diffraction requirement imposed by a 2D diffraction grating formed on the elements of an alignment mark.

In this regard, the illuminator tilt angle may be specific to an illumination wavelength employed, and a grating period in the features of an alignment mark within the patterning device. The use of coaxial illumination may help reduce complexities of setting up illumination sources in tilted illumination. Coaxial illumination may provide added benefits, including ease of illuminator mounting and alignment, independence from wavelength of illumination, ease of illuminator replacement, potential use of a single illuminator for both channels, and illumination uniformity.

Coaxial illumination source 602 may be mounted at different positions within pre-alignment system 600 depending on desired size and performance consideration of system 600, as will be further described herein. In some embodiments, coaxial illumination source 602 may be a laser produced plasma. In some embodiments, coaxial illumination source 602 may be used to illuminate all optical channels/paths simultaneously (e.g. an upper light path and one of the plurality of lower light paths) for imaging and/or other applications.

As previously indicated, upper light path 504 and lower light path 506 may be configured to process and measure different properties of the received patterning device image. In some embodiments, multipath sensory array 502 may include one, two, or more light paths that can be equipped to measure different attributes of the patterning device image.

Figure 7:
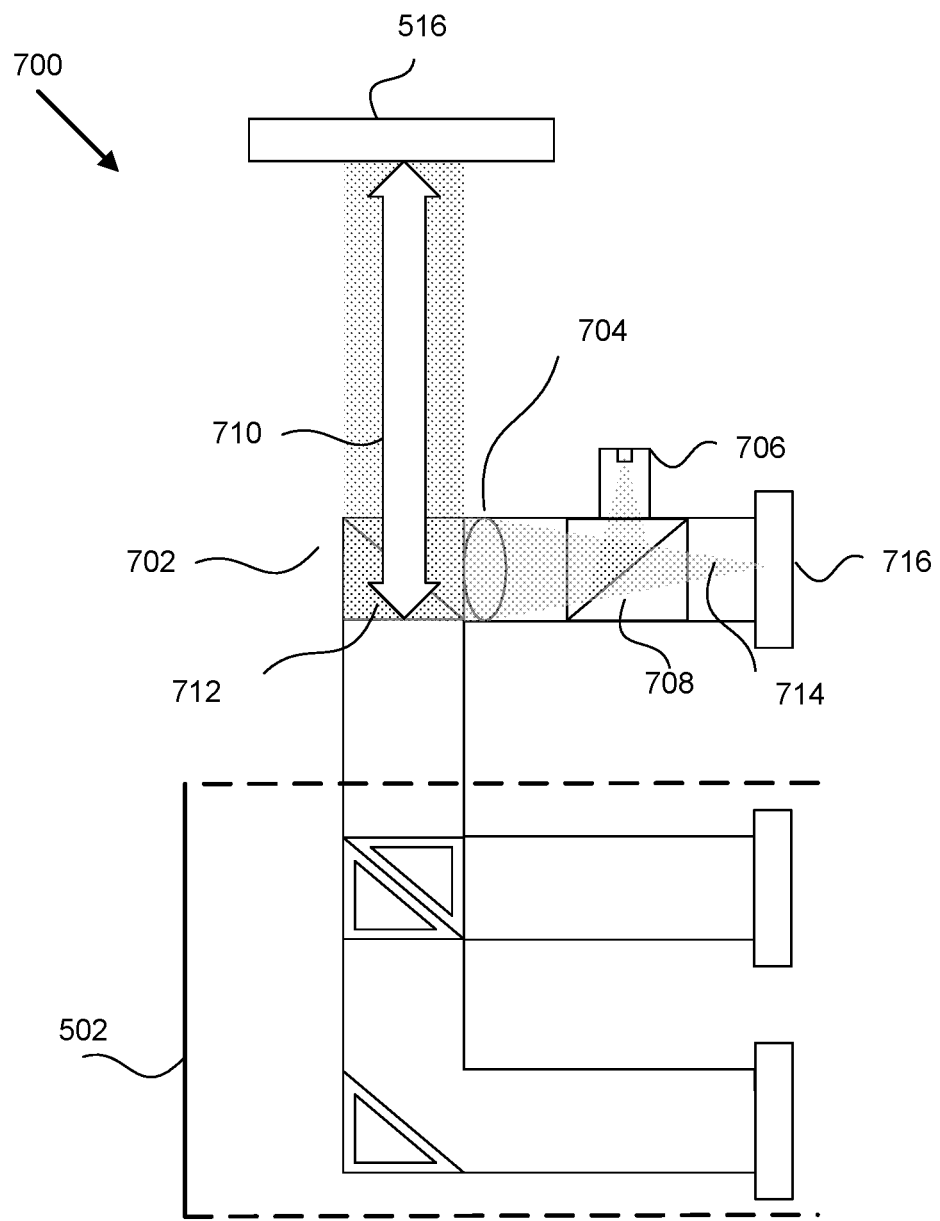
FIG. 7 shows a schematic of a pre-alignment sensor including a collimating optical branch as a level sensor, according to some embodiments.

FIG. 7 shows a schematic of a pre-alignment system 700 including a collimating optical branch as a level sensor, according to some embodiments. As previously indicated, patterning device level alignment (in the X and Y directions) is critical in the patterning device transfer stage of lithography. A patterning device that is not level or is misaligned may be damaged in transfer to an electrostatic chuck for example. Such misalignment may also lead to damage of the electrostatic chuck itself, causing added costs, and delays in processing. Moreover, such damage, may affect the accuracy of the lithographic process. Accordingly, pre-alignment system 700 shows a schematic for a multi-channel (e.g., multi-branch, multiple light path) system that measures patterning device position, orientation and tilt within a compact and efficient design, as further described herein.

In some embodiments, pre-alignment system 700 includes a three channel (branch) sensory array that incorporates an additional sensory array channel 702 from pre-alignment systems described in FIGS. 5 and 6. Sensory array channel 702 may be configured as a collimating channel by the inclusion of collimator 704 within the channel. Sensory array channel 702 may interchangeably be referred to as collimating light path 702. In some embodiments, collimating light path 702 may include a co-axial illumination source 706 coupled to beam splitter 708. Co-axial illumination source 706 provides incident illumination onto patterning device 516. After being illuminated, patterning device 516 may reflect the light beam, thus providing a retroreflected beam 710.

In some embodiments, the co-axial illumination may be a Kohler illumination that acts to generate an even illumination and ensures that an image of the illumination source is not visible in the resulting image. For example, Kohler illumination may act to generate an even illumination of an object, e.g., the patterning device or a reticle, and ensure that an image of the illumination source is not visible in the resulting image. Kohler co-axial illumination may provide the added benefit of reducing glare and uneven illumination. This will result in reduced interference with the generated patterning device image because the illumination source will not be visible.

In some embodiments, retroreflected beam 710 is split via beam splitter 712, and projected to (a) lower sensory array light paths 502 (for measuring positioning and Rx of the patterning device) and to (b) collimator 704 within collimating light path 702. Upon receiving the retroreflected beam 710, collimator 704 provides collimated light beam 714 projected onto an optical sensor, such as detector 716.

According to one embodiment, the multipath sensory array may include a combination of collimating light path 702 in combination with a lower multipath sensory array (e.g. sensory array 502 including upper light path 504 and lower light path 506). Such combination provides for performance and packaging benefits. For example, by combining collimating light path 702, designed to detect level gauge of a patterning device, and further, to measure the patterning device tilt with multipath sensory array 502 (which processes the patterning device image) provides for simplified packaging that separates interfering measurements. This implementation enables the combination of measuring characteristics of collimated light signals as well as measuring characteristics of image data of the patterning device in a single pre-alignment sensor device that incorporates compact packaging as well as performing multiple measurements of the patterning device.

In one example, pre-alignment system 700 may be configured to allow collimating light path 702 to be used simultaneously with any of the lower two light paths. This may reduce measurement time, processing power usage, processing capacity and the like, by extracting data only from sensors associated with the light paths.

Figure 8:
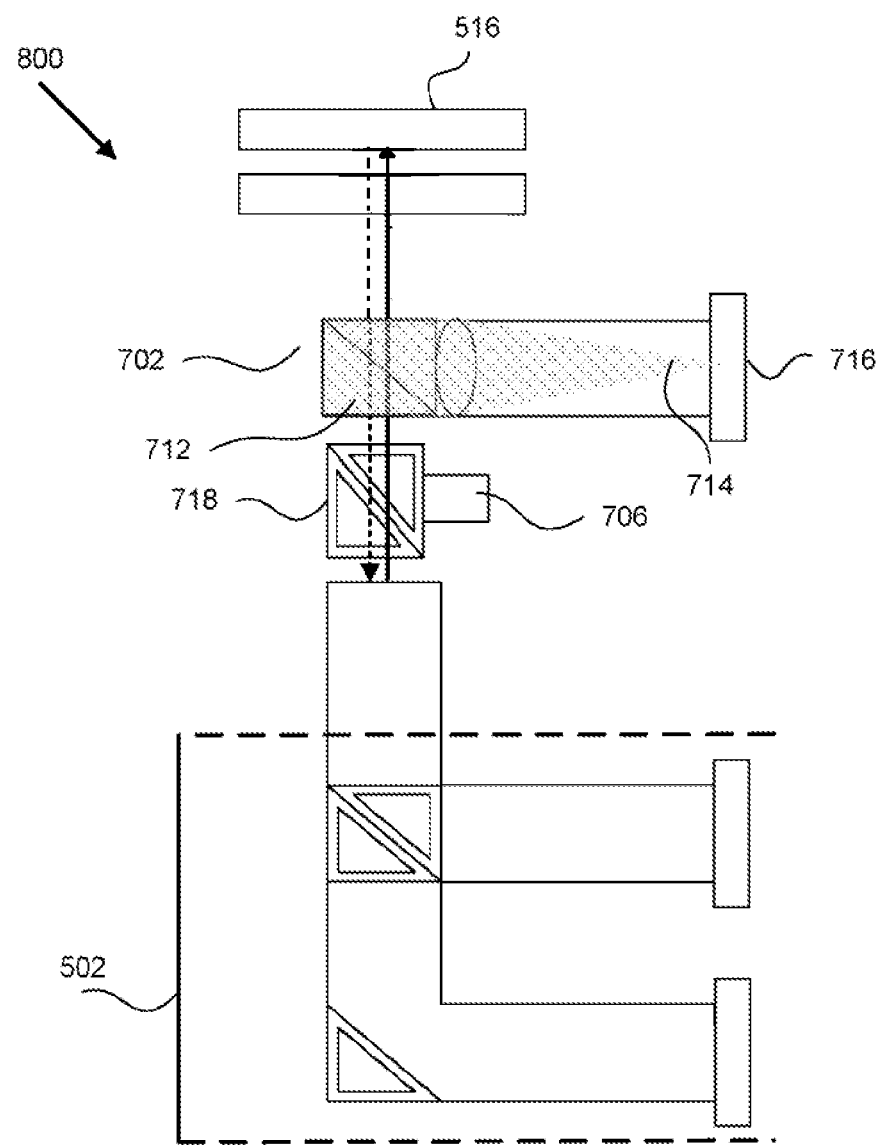
FIG. 8 shows a schematic of a pre-alignment sensor including a collimating optical branch and an illuminator block below a level sensor, according to some embodiments.

FIG. 8 shows a schematic of a pre-alignment system 800 including a collimating optical branch and an illuminator block below the level sensor, according to some embodiments. In some embodiments, the modular configuration of pre-alignment system 800 allows for the placement of the illumination source 706 in different positions, based on size requirements of the pre-alignment system itself, as well as the multichannel/multipath configuration. For example, the illuminator may be placed in a common space belonging to two or more channels (light paths). This may result in a reduction in light loss due to the minimal number of optical elements between the light source and the patterning device. Additionally, the illuminator may benefit from added space provided within the common space.

In some embodiments, illumination source 706 may be implemented as the sole illumination source for the entire pre-alignment system 800. This configuration may provide added benefits, such as module compactness and even illumination of the patterning device sample. Alternatively, illumination source 706 may be implemented as the illumination source for collimating light path 702, while a different illumination source/mechanism may be implemented for the lower branches (e.g. multipath sensory array 502). In one example, multipath sensory array 502 may be illuminated using tilted illumination, or other illumination means. In some embodiments, the patterning device may be positioned at different distances away from the sensors without requiring assembly adjustments to the sensors. This provides additional benefit with co-axial illumination source 706 because it would not require any additional illumination/sensor adjustments (as would be the case with external/tilted illumination sources).

In an exemplary embodiment, upon activation of co-axial illumination source 706, incident light beam is projected onto beam splitter 718, which splits the incident light upwards towards collimating light path 702 and patterning device 516 and downwards towards multipath sensory array 502. Collimating light path 702 initially receives the incident light and projects a collimated image of the light source onto detector 716 as a reference point (e.g. first point). When the incident light is reflected from patterning device 516, a reflected light beam is projected back onto beam splitter 712 and is then projected onto collimating light path 702 and multipath sensory array 502.

As previously indicated, the combination of the multipath sensory array 502 along with collimating light path 702 enables pre-alignment system 800 to perform a variety of measurements necessary for the coordination and transfer of the patterning device. Accordingly, in one embodiment, beam splitter 712 projects a received patterning device image onto collimating light path 702 and multipath sensory array 502. At this point, collimating light path 702 collimates the received image and projects it as a collimated beam (e.g. second point) on to detector 716. Accordingly, sensor 716 then measures a relative tilt of the patterning device by measuring a difference (deviation distance between the first point and the second point. A description of the operation of sensor 716 is further described herein below. As the collimated images are collimated to become a singular projection point, the content of the images is not pertinent to the measurements carried out by detector 716.

Figure 9:
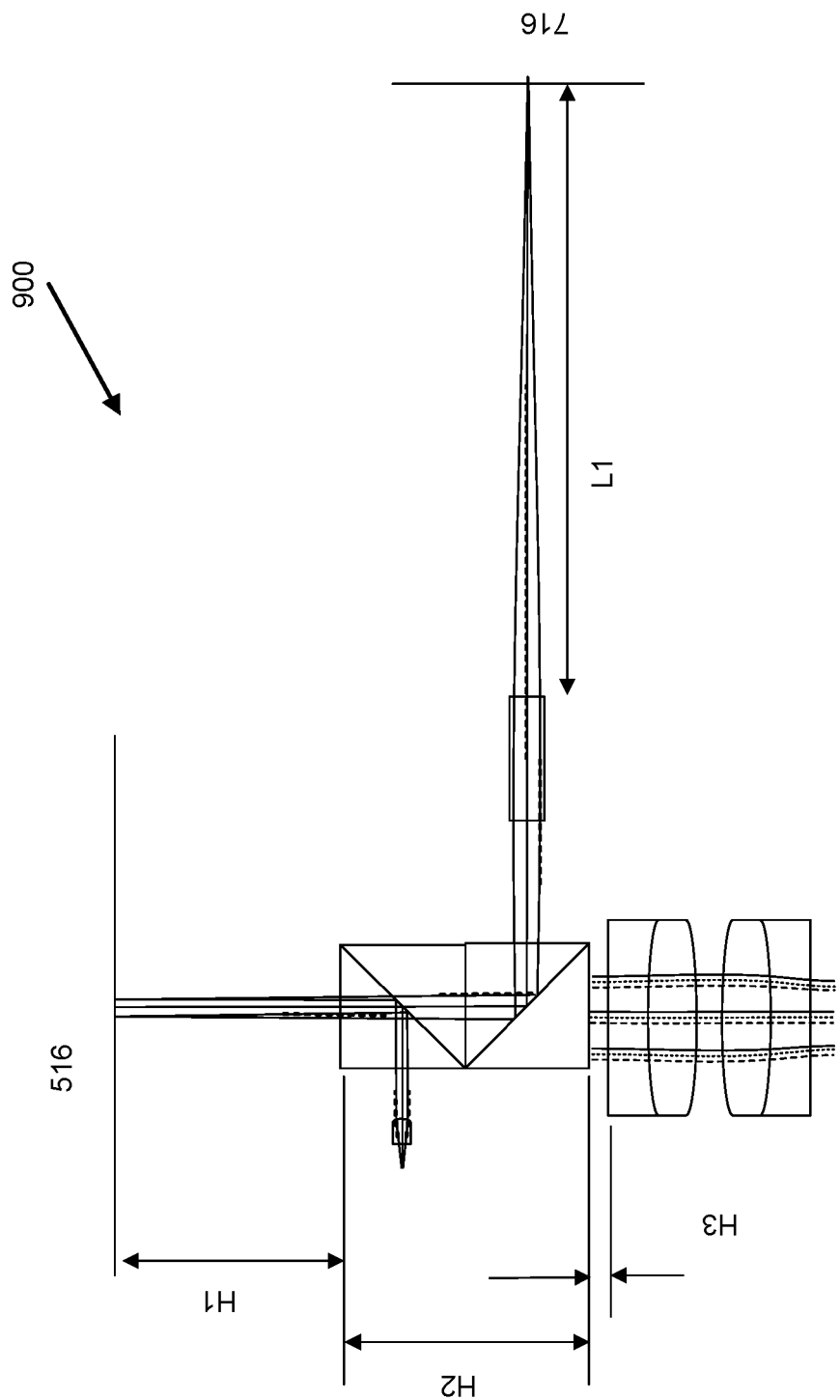
FIG. 9 shows a collimating level gauge sensor with illumination block being positioned above a collimator, according to some embodiments.

FIG. 9 shows a collimating level gauge sensor with illumination block being positioned above a collimator, according to some embodiments. In some embodiments, collimator 704 may be placed a certain distance L1 away from detector 716. L1 may be within a range of 80-120 mm. To achieve a desired signal/light sensitivity of 46 um/arcmin for a detector lens with $\Phi=4$ mm the collimator may be placed 100 mm away from detector 716. In some embodiments, the illumination block may be positioned above the collimator. In that regard, a distance H1 between optical elements associated with the illumination block (e.g. beam splitter) and a patterning device plane may be in the range between 16 mm and 22 mm, while a height of the beam splitter block H2 may be in the range between 18 mm and 22 mm. Moreover, a distance between the beam splitter block and optical elements in lower light path (H3) may be in the range of approximately 2 mm and 3 mm. This may be a minimal air gap between the lens and the beam splitter, such that the gap allows to avoid interference between lens mount and the cube mount. It is understood that the above noted dimensions are exemplary dimensions, and other dimensions may be applicable based on other size and measurement configurations of the patterning device and the measurement device.

In some embodiments, detector 716 may be configured to measure determine a tilt offset of the patterning device by determining a displacement distance between a point produced by the collimated beam received at detector 716 and a focal point of detector 716. For example, in some embodiments, a tilt of the patterning device along either the X axis or the Y axis may result in the displacement of the incident beam away from a focal point of detector 716. Accordingly, as an optical sensor, may measure the incident point of the collimated beam and determine a distance between the incident point and a focal point. Such offset may cause the detector to determine a tilt threshold of the patterning device. For example, if the collimated beam is received at a certain distance away from the focal point, pre-alignment system 800 may determine that patterning device 516 is tilted by a predetermined X and/or Y offset.

In some embodiments, tilt determination may be made at detector 716. In other embodiments, pre-alignment system 800 may include a processor, processing circuitry, a central processing unit (CPU), a microcontroller, or the like, that receives measurement output from detector 716 and calculates the reticle tilt. In some embodiments when a patterning device tilt is detected, the CPU may provide a patterning device transfer cancellation signal to cancel the patterning device transfer to a chuck, such as, for example, an electrostatic chuck. The CPU may also provide a determination signal to cancel the transfer operation to a processor of the lithographic apparatus LA and allow the LA to perform the cancellation signal, along with further processing steps to correct the tilt misalignment.

In yet another embodiment, in a case where a tilt is determined, a transfer of the patterning device may still occur when an alignment occurs between the patterning device and the patterning device chuck it is being transferred to. Accordingly, the CPU may provide tilt adjustment information to the lithographic apparatus to adjust the tilt of the patterning device, or in the alternative, provide the tilt adjustment information to the lithographic apparatus to adjust a tilt of the patterning device reticle to match the detected tilt of patterning device.

Figure 10:
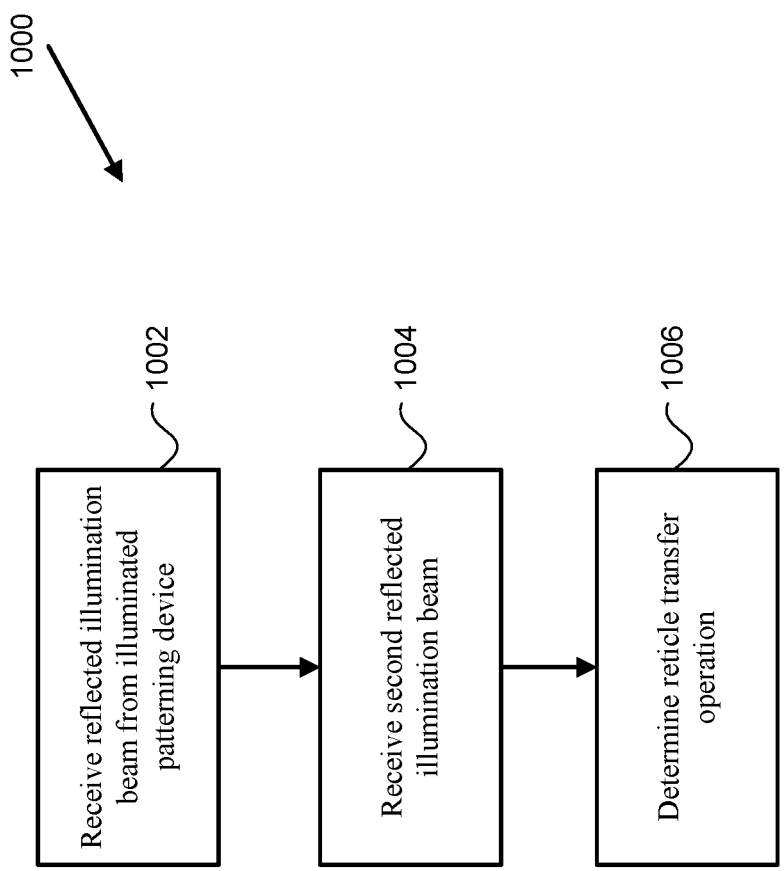
FIG. 10 shows a patterning device pre-alignment measurements performed by a pre-alignment sensor prior in a lithographic apparatus, according to some embodiments.

FIG. 10 shows a flow chart depicting an exemplary method 1000, according to some embodiments. It is to be appreciated that some steps may be performed out of order or optionally skipped. In some embodiments, a patterning device alignment detection operation or method may be implemented by, for example, pre-alignment system 800.

At step 1002, a first detector positioned at a first end of a first collimating light path receives reflected illumination beam from an illuminated patterning device. In one example, the first collimating light path is located within a multichannel sensory array including the first collimating light path and one or more other light paths.

At step 1004, a second detector positioned at a first end of the one or more other light paths receives a second reflected illumination beam from a beam splitter. In one example, the first detector is configured to calculate a tilt parameter of the illuminated patterning device and the second detector being configured to calculate an X-Y planar location position and a rotation position of the illuminated patterning device.

At step 1006, in response to a detection of a patterning device tilt, a patterning device transfer cancellation operation can be performed for a patterning device chuck, within a lithographic operation.

The pre-alignment sensors described herein may provide for compact design and enhanced accuracy in measurements of patterning device tilt. Such measurements are important to protect the patterning device and other internal components such as a patterning device chuck, and can help reduce added costs and inefficiencies as described herein. In some embodiments, the combination of a co-axial Kohler illumination with a collimating channel functioning as a level detector provides two primary functions of improved illumination techniques while also providing a measuring channel for detecting patterning device tilt. The co-axial Kohler illumination source may be incorporated within the measuring channel for more compact modular design. Moreover, the illumination provided by the Kohler co-axial illumination source may be used as a common light source for a multichannel system, such as pre-alignment system 800, and provides benefits such as module compactness, even illumination of the sample patterning device, and reduction of image artifacts and high contrast. Moreover, the common source illumination approach simplifies the system design and allows for a modular design of the pre-alignment system. Such modular design may enable the inclusion of additional modular channels to perform other measurements of the patterning device, while maintaining compactness and accuracy.

The embodiments may further be described using the following clauses:

1. A patterning device alignment system comprising:
   a multichannel sensory array including a first collimating light path and one or more other light paths;
   a first detector positioned at a first end of the first collimating light path; and
   a second detector positioned at a first end of the one or more other light paths,
   the first detector receiving a reflected illumination beam from an illuminated patterning device and configured to calculate a tilt parameter of the patterning device, and
   the second detector receiving a second reflected illumination beam from a beam splitter and configured to calculate an X-Y planar location position and a rotation position of the patterning device.

2. The patterning device alignment system of clause 1, wherein the first collimating light path includes the beam splitter and a collimator, the beam splitter being located at a second end of the first collimating light path that is opposite the first end, and being configured to split the reflected illumination beam into a first reflected illumination beam and the second reflected illumination beam, the first reflected illumination beam being directed towards a collimator that narrows the first illumination beam onto the first detector.

3. The patterning device alignment system of clause 2, wherein the collimator is located within the first collimating light path.

4. The patterning device alignment system of clause 2, further comprising a light source that illuminates the patterning device, the light source being a co-axial Kohler illumination source.

5. The patterning device alignment system of clause 4, wherein the light source is positioned at an inline position between the first collimating light path and the one or more other light paths.

6. The patterning device alignment system of clause 4, wherein the light source is positioned within the first collimating light path.

7. The patterning device alignment system of clause 1, further comprising:
   a controller including circuitry configured to
   receive the calculated tilt parameter of the patterning device from the first detector, and
   in response to the tilt parameter being above a threshold, provide a determination triggering a cancellation of a patterning device transfer operation to a patterning device chuck.

8. The patterning device alignment system of clause 4, wherein the light source simultaneously illuminates the first collimating light path and one of the one or more other light paths.

9. The patterning device alignment system of clause 2, further comprising a light source that generates a collimated beam, the collimated beam illuminates the patterning device, wherein the first detector is configured to measure the patterning device tilt based on a displacement measurement between a focal point of the detector and a point created by the received first reflected illumination beam.

10. The patterning device alignment system of clause 9, wherein the first detector includes a plurality of sensor arrays.

11. A lithographic apparatus comprising:
   a patterning device alignment system comprising
   a multichannel sensory array including a first collimating light path and one or more other light paths;
   a first detector positioned at a first end of the first collimating light path; and
   a second detector positioned at a first end of the one or more other light paths,
      the first detector receiving a reflected illumination beam from an illuminated patterning device and configured to calculate a tilt parameter of the patterning device, and
      the second detector receiving a second reflected illumination beam from a beam splitter and configured to calculate an X-Y planar location position and a rotation position of the patterning device.

12. The lithographic apparatus of clause 11, wherein the first collimating light path includes the beam splitter and a collimator, the beam splitter being located at a second end of the first collimating light path that is opposite the first end, and being configured to split the reflected illumination beam into a first reflected illumination beam and the second reflected illumination beam, the first reflected illumination beam being directed towards a collimator that narrows the first illumination beam onto the first detector.

13. The lithographic apparatus of clause 12, wherein the collimator is located within the first collimating light path.

14. The lithographic apparatus of clause 12, further comprising a light source that illuminates the patterning device, the light source being a co-axial Kohler illumination source.

15. The lithographic apparatus of clause 14, wherein the light source is positioned at an inline position between the first collimating light path and the one or more other light paths.

16. The lithographic apparatus of clause 14, wherein the light source is positioned within the first collimating light path.

17. The lithographic apparatus of clause 11, further comprising:
   a controller including circuitry configured to
   receive the calculated tilt parameter of the patterning device from the first detector, and
   in response to the tilt parameter being above a threshold, provide a determination triggering a cancellation of a patterning device transfer operation to a patterning device chuck.

18. The lithographic apparatus of clause 14, wherein the light source simultaneously illuminates the first collimating light path and one of the one or more other light paths.

19. The lithographic apparatus of clause 12, further comprising a light source that generates a collimated beam, the collimated beam illuminates the patterning device, wherein the first detector is configured to measure the patterning device tilt based on a displacement measurement between a focal point of the detector and a point created by the received first reflected illumination beam.

20. The lithographic apparatus of clause 19, wherein the first detector includes a plurality of sensor arrays.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation," "beam," and "light" used herein may encompass all types of electromagnetic radiation, for example, ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein may describe a material onto which material layers are added. In some embodiments, the substrate itself can be patterned and materials added on top of it may also be patterned, or may remain without patterning.

Although specific reference can be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "patterning device," "reticle," "wafer," or "die" in this text should be considered as being replaced by the more general terms "mask," "substrate," and "target portion," respectively.

While specific embodiments of the invention have been described above, it will be appreciated that the invention can be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. A patterning device alignment system comprising:
a multichannel sensory array including a first collimating radiation path and one or more other radiation paths;
a first detector positioned at a first end of the first collimating radiation path; and
a second detector positioned at a first end of the one or more other radiation paths,
the first detector arranged to receive a reflected illumination beam from an illuminated patterning device and configured to calculate a tilt parameter of the patterning device, and
the second detector arranged to receive a second reflected illumination beam from a beam splitter and configured to calculate an X-Y planar location position and a rotation position of the patterning device.

2. The patterning device alignment system of claim 1, wherein the first collimating radiation path includes the beam splitter and a collimator, the beam splitter being located at a second end of the first collimating radiation path that is opposite the first end, and being configured to split the reflected illumination beam into a first reflected illumination beam and the second reflected illumination beam, the first reflected illumination beam being directed towards a collimator that narrows the first illumination beam onto the first detector.

3. The patterning device alignment system of claim 2, wherein the collimator is located within the first collimating radiation path.

4. The patterning device alignment system of claim 2, further comprising a radiation source configured to illuminate the patterning device, the radiation source being a co-axial Kohler illumination source.

5. The patterning device alignment system of claim 4, wherein the radiation source is positioned at an inline position between the first collimating radiation path and the one or more other radiation paths.

6. The patterning device alignment system of claim 4, wherein the radiation source is positioned within the first collimating radiation path.

7. The patterning device alignment system of claim 4, wherein the radiation source is configured to simultaneously illuminate the first collimating radiation path and one of the one or more other radiation paths.

8. The patterning device alignment system of claim 2, further comprising a radiation source configured to generate a collimated beam to illuminate the patterning device, wherein the first detector is configured to measure the patterning device tilt based on a displacement measurement between a focal point of the detector and a point created by the received first reflected illumination beam.

9. The patterning device alignment system of claim 8, wherein the first detector includes a plurality of sensor arrays.

10. The patterning device alignment system of claim 1, further comprising a controller including circuitry configured to:
receive the calculated tilt parameter of the patterning device from the first detector, and
in response to the tilt parameter crossing a threshold, provide a determination triggering a cancellation of a patterning device transfer operation to a patterning device chuck.

11. A lithographic apparatus comprising:
a patterning device alignment system comprising
a multichannel sensory array including a first collimating radiation path and one or more other radiation paths;
a first detector positioned at a first end of the first collimating radiation path; and
a second detector positioned at a first end of the one or more other radiation paths,
the first detector configured to receive a reflected illumination beam from an illuminated patterning device and configured to calculate a tilt parameter of the patterning device, and
the second detector configured to receive a second reflected illumination beam from a beam splitter and configured to calculate an X-Y planar location position and a rotation position of the patterning device; and
a pattern transfer system configured to cause transfer of a pattern of the patterning device to a substrate.

12. The lithographic apparatus of claim 11, wherein the first collimating radiation path includes the beam splitter and a collimator, the beam splitter being located at a second end of the first collimating radiation path that is opposite the first end, and being configured to split the reflected illumination beam into a first reflected illumination beam and the second reflected illumination beam, the first reflected illumination beam being directed towards a collimator that narrows the first illumination beam onto the first detector.

13. The lithographic apparatus of claim 12, wherein the collimator is located within the first collimating radiation path.

14. The lithographic apparatus of claim 12, further comprising a radiation source configured to illuminate the patterning device, the radiation source being a co-axial Kohler illumination source.

15. The lithographic apparatus of claim 14, wherein the radiation source is positioned at an inline position between the first collimating radiation path and the one or more other radiation paths.

16. The lithographic apparatus of claim 14, wherein the radiation source is positioned within the first collimating radiation path.

17. The lithographic apparatus of claim 14, wherein the radiation source is configured to simultaneously illuminate the first collimating radiation path and one of the one or more other radiation paths.

18. The lithographic apparatus of claim 12, further comprising a radiation source configured to generate a collimated beam to illuminate the patterning device, wherein the first detector is configured to measure the patterning device tilt based on a displacement measurement between a focal point of the detector and a point created by the received first reflected illumination beam.

19. The lithographic apparatus of claim 18, wherein the first detector includes a plurality of sensor arrays.

20. The lithographic apparatus of claim 11, further comprising a controller including circuitry configured to:
- receive the calculated tilt parameter of the patterning device from the first detector, and
- in response to the tilt parameter crossing a threshold, provide a determination triggering a cancellation of a patterning device transfer operation to a patterning device chuck.

* * * * *